(12) United States Patent
Wang et al.

(10) Patent No.: US 7,671,385 B2
(45) Date of Patent: Mar. 2, 2010

(54) IMAGE SENSOR AND FABRICATION METHOD THEREOF

(75) Inventors: Hsin-Heng Wang, Hsinchu County (TW); Chiu-Tsung Huang, Hsinchu (TW); Shih-Siang Lin, Taipei County (TW)

(73) Assignee: Powerchip Semiconductor Corp., Hsin-Chu (TW)

( * ) Notice: Subject to any disclaimer, the term of this patent is extended or adjusted under 35 U.S.C. 154(b) by 407 days.

(21) Appl. No.: 11/686,957

(22) Filed: Mar. 15, 2007

(65) Prior Publication Data

US 2008/0224136 A1 Sep. 18, 2008

(51) Int. Cl.
*H01L 31/0224* (2006.01)
*H01L 31/075* (2006.01)

(52) U.S. Cl. .................. 257/233; 257/294; 257/435; 257/E27.141; 438/71; 438/74

(58) Field of Classification Search .................. 257/222, 257/294, 432, 435, E31.122, 233, E27.141; 438/60, 69, 71, 75, 74
See application file for complete search history.

(56) References Cited

U.S. PATENT DOCUMENTS

2008/0042230 A1* 2/2008 Miida .................. 257/458

* cited by examiner

*Primary Examiner*—M. Wilczewski
*Assistant Examiner*—Toniae M Thomas
(74) *Attorney, Agent, or Firm*—Winston Hsu

(57) ABSTRACT

An image sensor contains a semiconductor substrate, a plurality of pixels defined on the semiconductor substrate, a photo conductive layer and a transparent conductive layer formed on the pixel electrodes of the pixels in order, and a shield device positioned between any two adjacent pixel electrodes. The shield device has a shield electrode and an isolation structure surrounding the shield electrode so that the shield electrode is isolated from the pixel electrodes and the photo conductive layer by the isolation structure.

22 Claims, 12 Drawing Sheets

IMAGE SENSOR AND FABRICATION METHOD THEREOF

BACKGROUND OF THE INVENTION

1. Field of the Invention

The present invention relates to an image sensor, and more particularly, to an image sensor with a shield device for solving carrier cross-talk problems.

2. Description of the Prior Art

The image sensor such as complementary metal oxide semiconductor (CMOS) or charge coupled device (CCD) is a silicon semiconductor device designed to capture photons and convert them into electrons. Electrons, once converted, must then be transferred and converted again to voltage which can be measured and turned into digital data. The photoconductor-on-active-pixel (POAP) image sensor has been studied to pursue advantages over the conventional CCD or CMOS image sensor. The POAP image sensor has a hydrogenated amorphous silicon (α-Si:H) based structure stacking on CCD or CMOS elements. The high fill factor brought by its stacking structure will provide the full of pixel area to be available for photo sensing, thereby achieving the high quantum efficiency in conjunction with the direct energy transition of α-Si:H material. However, this type of sensor still has cross-talk, image lag, and dark leakage signal problems in the past study. In particular, the problem of carrier cross-talk across adjacent pixels causes the serious resolution and uniformity degradation at the photo response, also brings the color cross-talk over the pixels that produces the poor color fidelity.

Referring to FIGS. 1-2, FIG. 1 is a cross-sectional schematic diagram of a POAP image sensor 10 according to the prior art, and FIG. 2 is a potential simulation diagram of adjacent pixel electrodes shown in FIG. 1. The prior-art image sensor 10 comprises a plurality of pixels 14a, 14b, a dielectric layer 16 disposed on a substrate 12, a plurality of pixel circuit (not shown) disposed in each pixel 14a, 14b, a plurality of pixel electrodes 18a, 18b positioned on the pixel circuits and the dielectric layer 16, a photo conductive layer 20 on the pixel electrodes 18a, 18b, and a transparent electrode 28 on the photo conductive layer 20, wherein the photo conductive layer 20 comprises an n-type layer (n-layer) 22, an intrinsic layer (i-layer) 24, and a p-type layer (p-layer) 26 from bottom to top, which constitute so-called stacked p-i-n layer structure for accepting light and converging light into corresponding charges according to the light intension.

However, the different pixel electrodes 18a, 18b of the prior-art image sensor 10 may have various voltages under illumination, resulted in an electric filed with potential difference between the adjacent pixels 14a, 14b. For example, if the pixel electrode 18b has a high potential $V_H$, and the pixel electrode 18a has a low potential $V_L$ under illumination, as the transparent conductive layer 28 is grounded, dark leakage current will occur between the adjacent pixels 14a, 14b, flowing from the pixel electrode 18b with the high potential $V_H$ to the nearby pixel electrode 18a with the low potential $V_L$, as shown in FIG. 2. There, the cross-talk problem occurs and influence the accuracy of sensing images, resulted in poor sensing fidelity.

As a result, to improve the structure of the POAP image sensor for avoiding cross-talk problems of adjacent pixels so as to provide a good performance of sensing images is still an important issue for the manufacturers.

SUMMARY OF THE INVENTION

It is a primary objective of the claimed invention to provide an image sensor with a shield device and the fabrication method thereof to solve the above-mentioned cross-talk problem of the conventional image sensors.

According to the claimed invention, the present invention image sensor comprises a semiconductor substrate, a plurality of pixels defined on the semiconductor substrate, a photo conductive layer and a transparent conductive layer. Each of the pixels comprises a pixel electrode, and the photo conductive layer and the transparent conductive layer are positioned on the pixel electrode in order. The present invention image sensor further comprises a shield device disposed between any two adjacent pixel electrodes. The shield device comprises a shield electrode and an isolation structure surrounding the shield electrode to isolate the shield electrode from the pixel electrodes and the photo conductive layer.

According to the claimed invention, a method of fabricating an image sensor is further provided. The present invention method comprises providing a substrate; forming a first conductive layer on the surface of the substrate, removing portions of the first conductive layer to form a plurality of pixel electrodes; forming a first isolation layer and a second conductive layer on the substrate in order; removing portions of the second conductive layer and first isolation layer positioned on the pixel electrodes; forming a second isolation layer on the substrate; removing portions of the second isolation layer positioned on the pixel electrodes; and forming a photo conductive layer and a transparent conductive layer on the substrate in order. The residual portion of the second conductive layer constitutes a shield electrode disposed between any two adjacent pixel electrodes, the residual first isolation layer and second isolation layer compose an isolation structure surrounding the shield electrode, and the shield electrode and the isolation structure form a shield device.

It is an advantage of the present invention that a shield device is formed between any two adjacent pixels or any two adjacent pixel electrodes such that the cross-talk problems occurring between pixels in the conventional image sensors can be avoided. Also, the performance of the image sensor and sensitivity are improved.

These and other objectives of the present invention will no doubt become obvious to those of ordinary skill in the art after reading the following detailed description of the preferred embodiment that is illustrated in the various figures and drawings.

DETAILED DESCRIPTION

Figure 3:
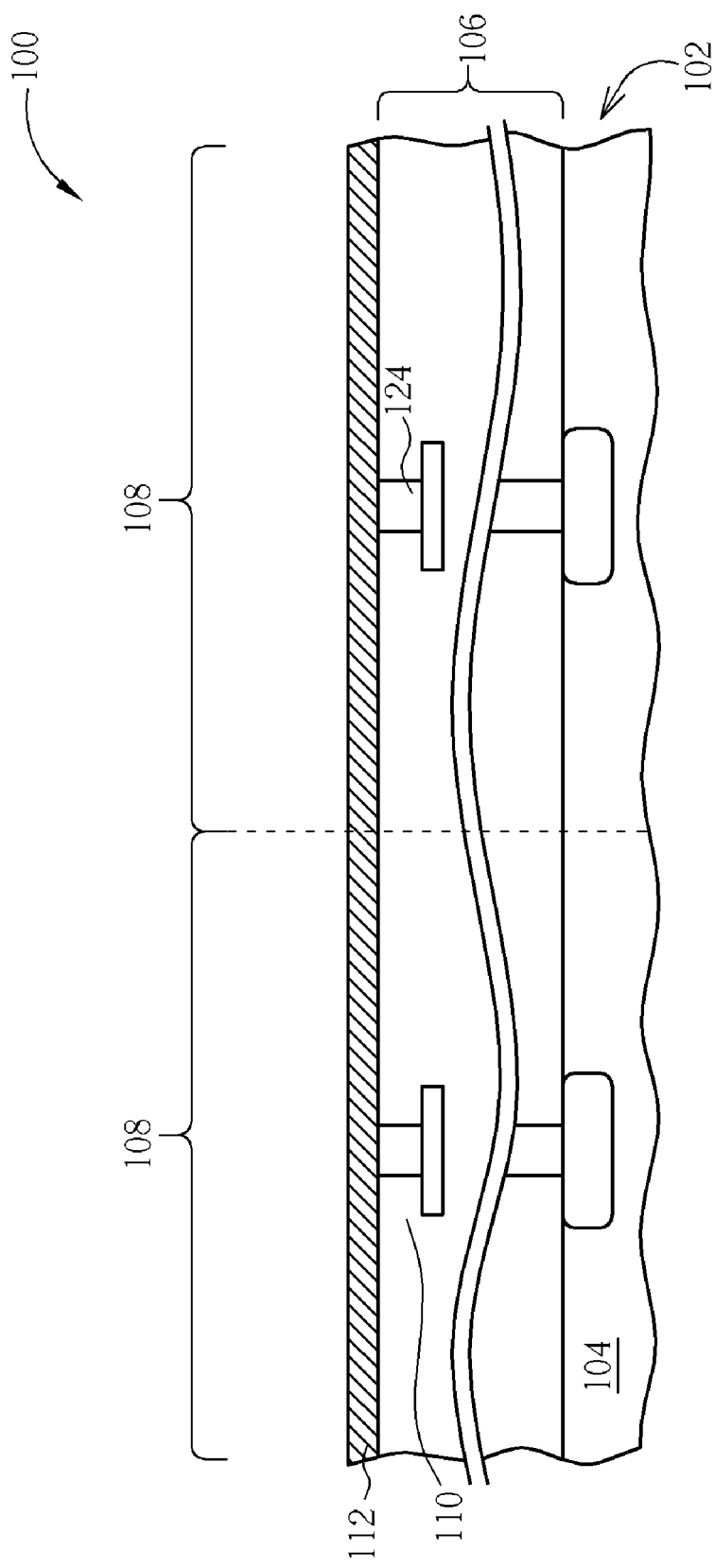
FIGS. 3-9 are schematic diagrams of an image sensor structure and the fabrication process according to the present invention.
Figure 4:
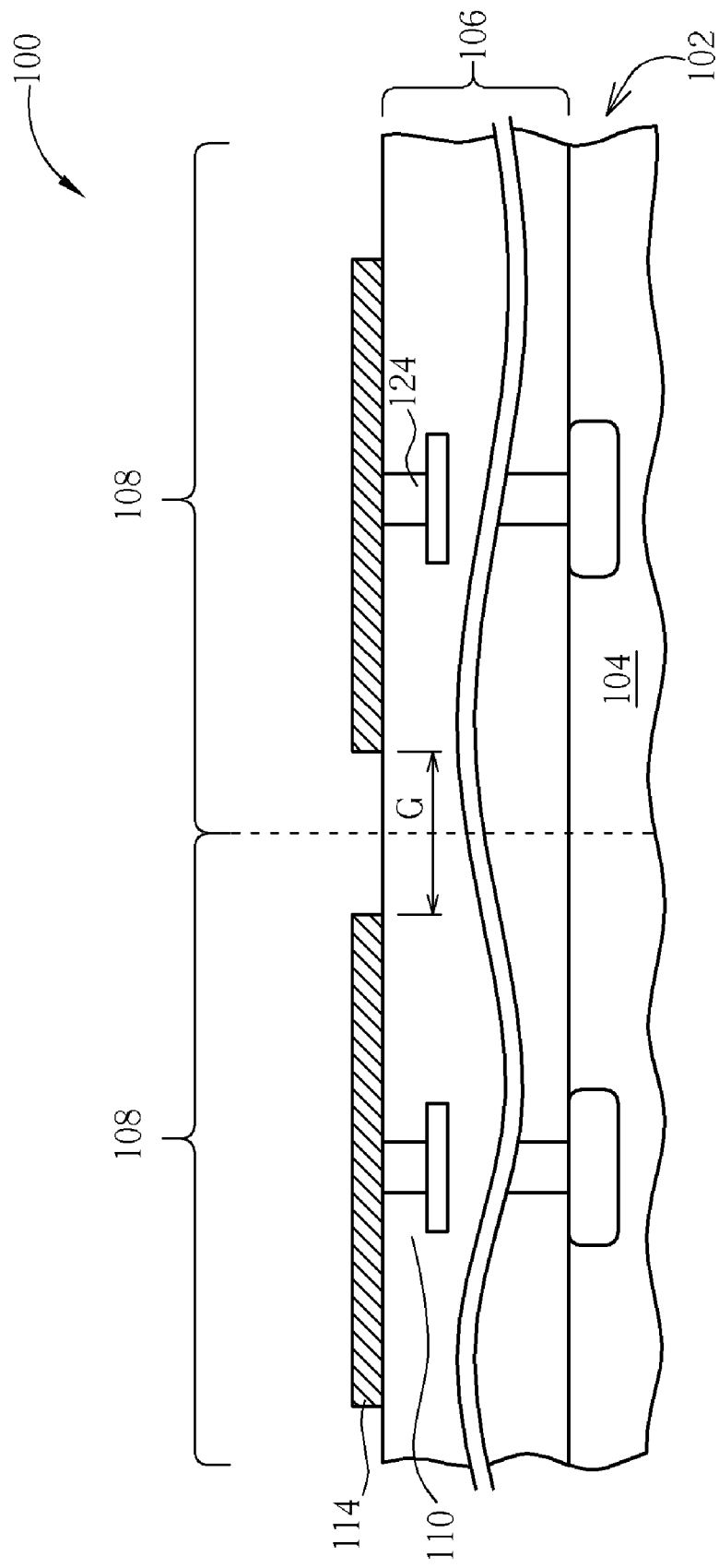

Please refer to FIG. 3 to FIG. 9, wherein FIGS. 3-9 are schematic diagrams of an image sensor structure 100 and the fabrication process according to the present invention. The present invention image sensor 100 is a POAP image sensor. First, as shown in FIG. 3, a semiconductor chip 102 is provided, and the semiconductor chip 102 comprises a semiconductor substrate 104, such as a silicon substrate, with a plurality of pixels 108 defined thereon and forming a pixel matrix. Then, a plurality of electric devices is provided on the semiconductor substrate 104 to form pixel circuits 110 in the dielectric layer 106. A first conductive layer 112 is formed on the dielectric layer 106, above the pixel circuits 110, wherein the first conductive layer 112 may comprise metal materials, preferable titanium nitride (TiN). Thereafter, as shown in FIG. 4, a first photolithography process is performed, and the steps of the first photolithography process comprises forming a photoresist layer (not shown) on the semiconductor substrate 104; defining the pattern of the pixel electrodes on the photoresist layer by utilizing a photomask with a pixel electrode pattern; performing an etching process to remove portions of the first conductive layer 112; removing the photoresist so as to form a pixel electrode 114 in each pixel 108. Each pixel electrode 114 is electrically connected to the corresponding pixel circuit 110 through the contact holes 124, and an electrode gap G occurs between adjacent pixel electrodes 114.

Figure 5:
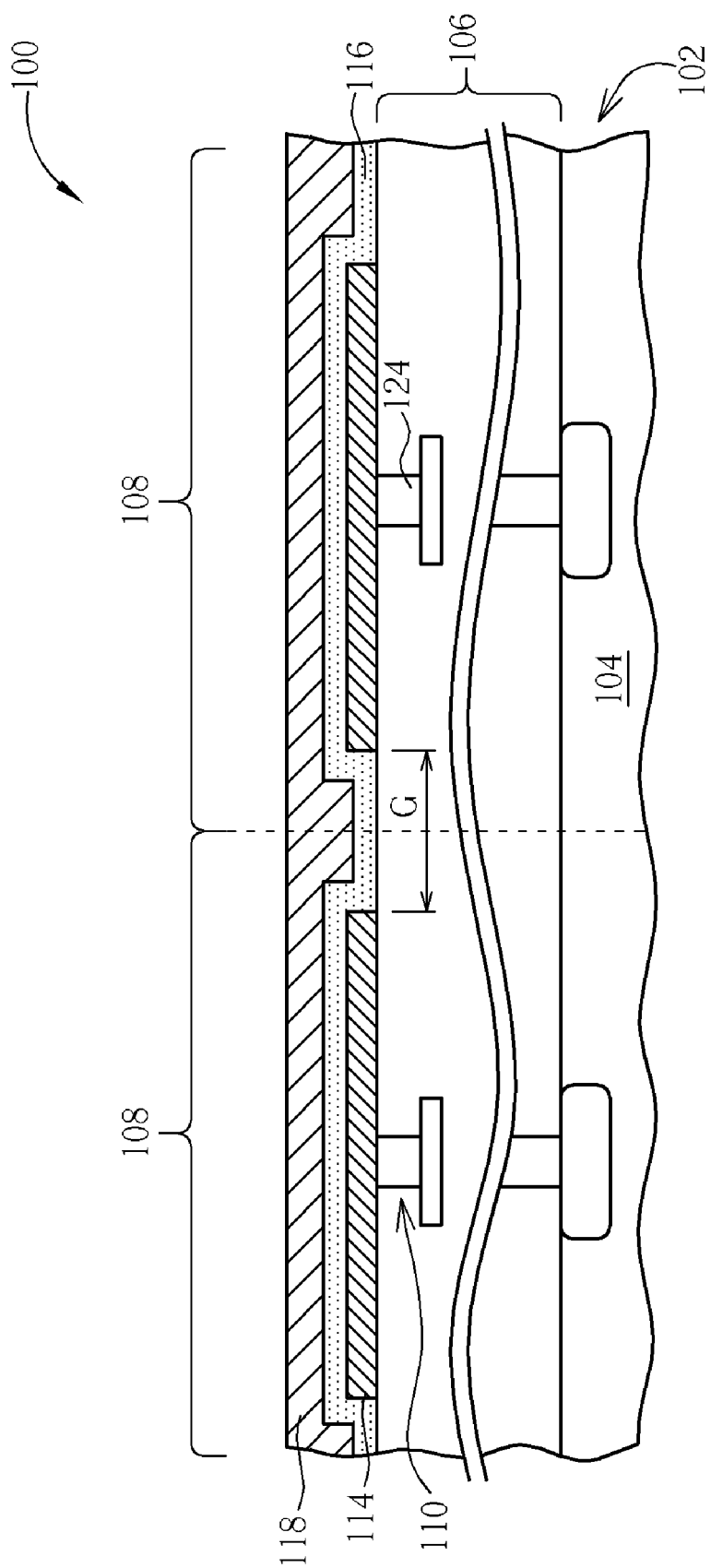
Figure 6:
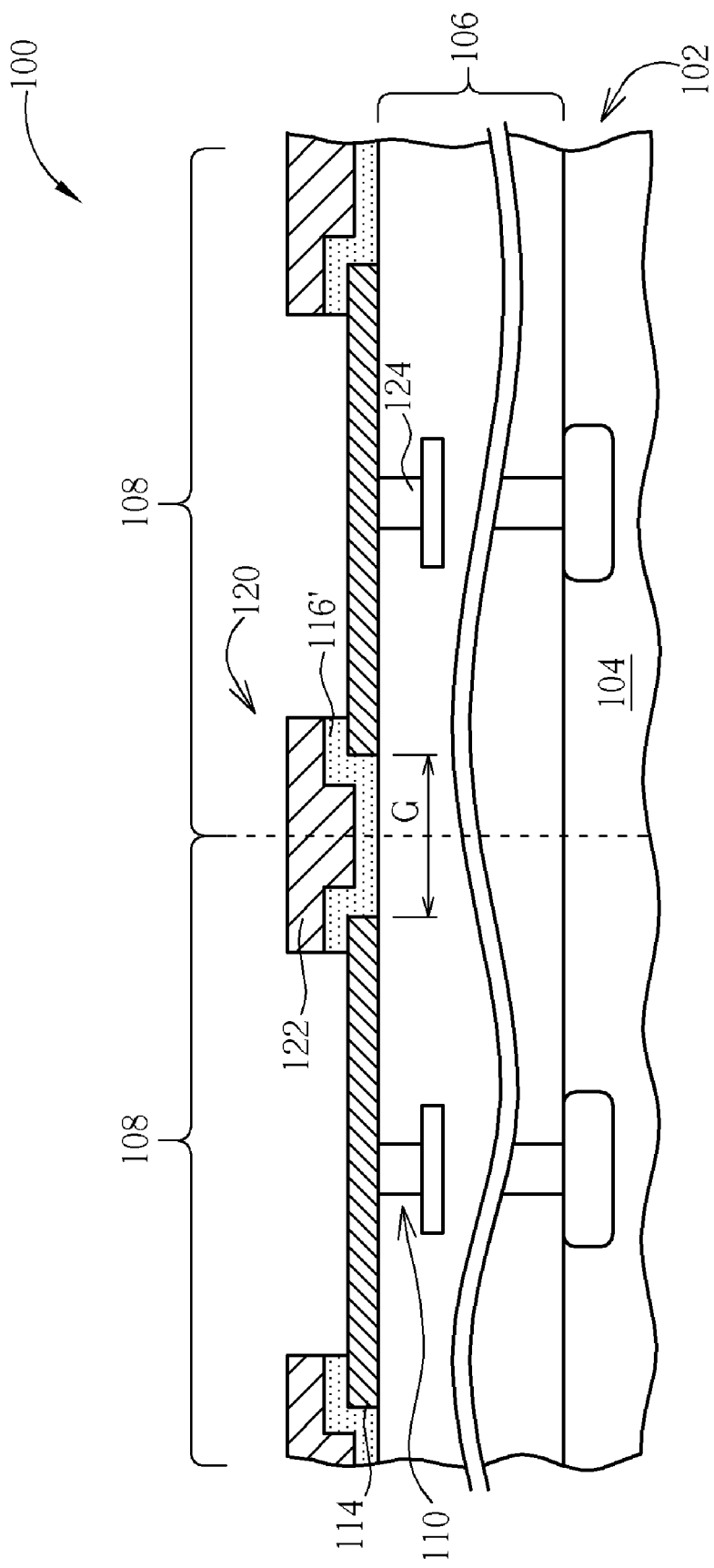

Referring to FIG. 5, a first isolation layer 116 and a second conductive layer 118 are successively formed on the semiconductor substrate 104, covering the surfaces of the pixel electrodes 114 and the exposed dielectric layer 106. The first isolation layer 116 may comprise oxide materials, such as silicon oxide ($SiO_2$), and may be formed through a deposition process. And the second conductive layer 118 may comprise polysilicon material or metal material. Since the second conductive layer 118 may be formed with a deposition process, it can be self-aligned filled into the electrode gap G. As shown in FIG. 6, a photolithography-etching process (PEP) is then carried out, which includes a second photolithography process comprising forming a photoresist layer (not shown) on the second conductive layer 118, performing a second photolithography process by utilizing the same photomask used in the first photolithography process to transfer a complementary pattern 120, contrary to the pattern of the pixel electrodes 114, to the photoresist layer, and performing an etching process by taking the patterned photoresist as an etching mask to remove portions of the second conductive layer 118 and the first isolation layer 116 so as to exposing most portions of the pixel electrodes 114. The residual second conductive layer forms a shield electrode 122 disposed between any two adjacent pixel electrodes 114 and has a sectional view of T-shape profile. In addition, the residual first isolation layer 116' is positioned under the shield electrode 122 so as to separate and isolate the shield electrode 122 form the pixel electrodes 114 and the dielectric layer 106. In a preferable embodiment of the present invention, the photolithography ratio of the second photolithography process may be adjusted to make the complementary pattern 120 has a width a little bigger than the electrode gap G, thus the edge portions of the pixel electrodes 114 are covered by the first residual isolation layer 116' and the shield electrode 122.

Figure 7:
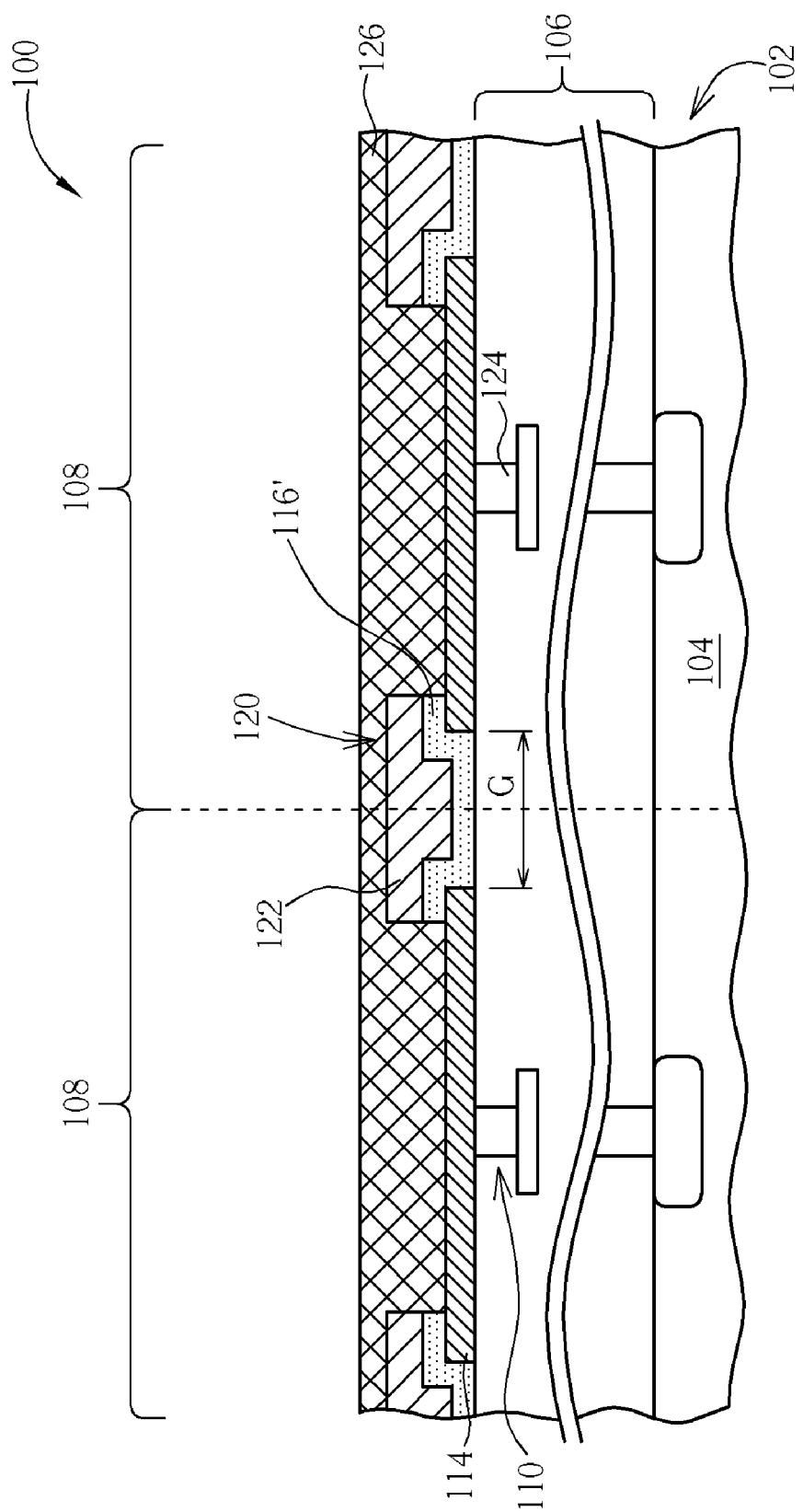
Figure 8:
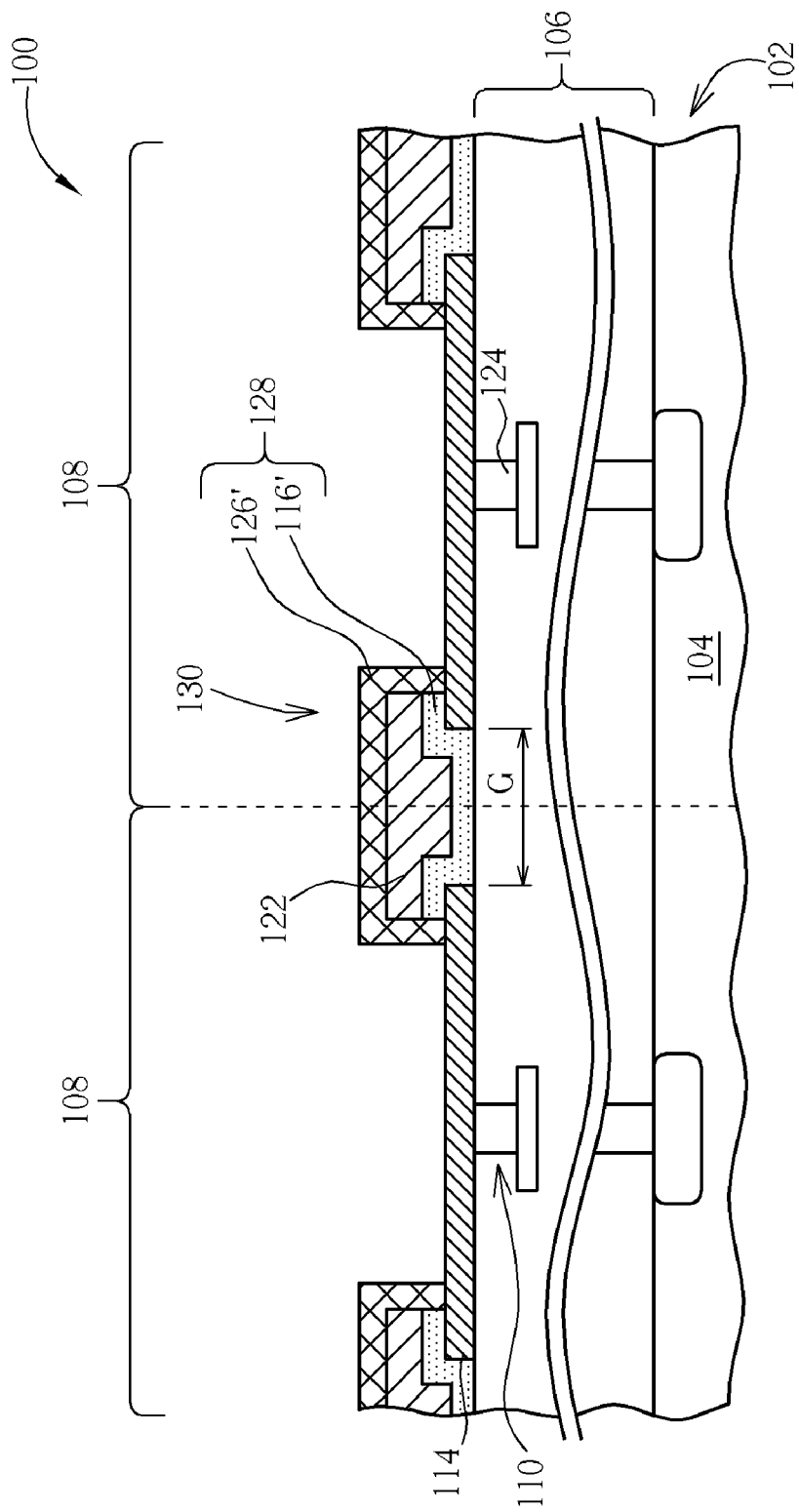

Then, referring to FIG. 7, a second isolation layer 126 is formed on the semiconductor substrate 104, wherein the second isolation layer 126 may comprise silicon oxide or silicon nitride (SiN). As shown in FIG. 8, a third photolithography process is performed, which comprises forming a photoresist layer (not shown) on the surface of the second isolation layer 126; performing a photolithography process to define a complementary pattern of the pixel electrode pattern on the photoresist layer by utilizing the same photomask used in the first photolithography process; and removing portions of the second isolation layer 126 while taking the patterned photoresist layer as an etching photomask. In a preferable embodiment, the photolithography ratio may be set so that the residual second isolation layer 126' has a width a little bigger than the width of the shield electrode 122 and the electrode gap G, so that the edge portions of the pixel electrodes 114 is covered by the residual second isolation layer 126', and the shield electrode 122 is isolated from other elements. However, in various embodiments, an etch-back process may be adopted to remove portions of the second isolation layer 126 to form the residual second isolation layer 126' shown in FIG. 8. It should be noted that the second and third photolithography processes utilize the same photomask used in the first photolithography process to define complementary patterns and therefore the photoresist materials of the first photolithography process and the second or third photolithography process should be different type. For example, when the first photolithography process adopts a positive photoresist material to define the pattern of the pixel electrodes 114, the second and third photolithography processes should utilize a negative photoresist material for defining a complementary pattern contrary to the pattern of the pixel electrodes 114. Contrariwise, the first photolithography process adopts a negative photoresist material while the second and third photolithography processes utilizes a positive photoresist material.

As shown in FIG. 8, the residual first isolation layer 116', the residual second isolation layer 126', and the shield electrode 122 compose a shield device 130 disposed between any two adjacent pixel electrodes 114 or any two adjacent pixels 108, covering edge portions of the pixel electrodes 114 and exposing most portions of the pixel electrodes 114. The residual first isolation layer 116' and the residual second isolation layer 126' constitute an isolation structure 128 of the shield device 130 surrounding the bottom and top sides of the shield electrode 122 so that the shield electrode 122 is isolated from the pixel electrodes 114 and other elements fabricated in the following processes. In addition, the bottom surface of the isolation structure 128 and the bottom surfaces of the pixel electrodes 114 are approximately at the same level and on the surface of the dielectric layer 106.

Figure 9:
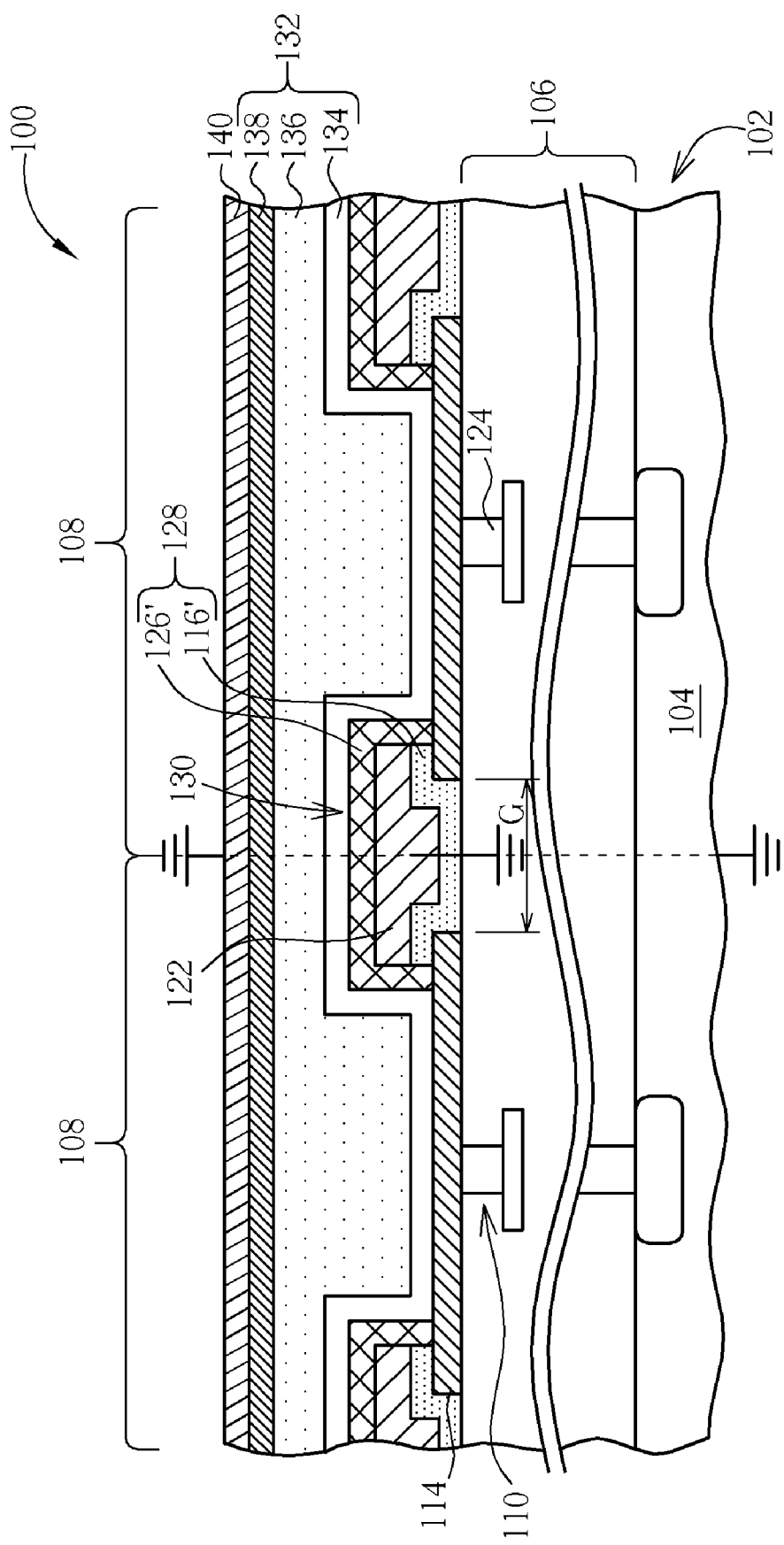

Please refer to FIG. 9. A photo conductive layer 132 is formed on the pixel electrodes 114 and the shield device 130, wherein the photo conductive layer 132 comprises an n-layer 134, an i-layer 136, and a p-layer 138 stacked from bottom to top. The n-layer 134 and the p-layer 138 may comprise hydrogenated amorphous silicon carbide ($\alpha$-SiC:H) materials, and the i-layer 136 may comprise hydrogenated amorphous silicon material. The n-layer 134 may direct contact and electrically connected to the pixel electrodes 114 not covered by the shield device 130. In other embodiments, the photo conductive layer 132 may comprise a p-layer, an i-layer, and an n-type from bottom to top. Then, a transparent conductive layer 140 is formed on the photo conductive layer 132 that may comprise indium tin oxide (ITO) for completing the fabrication of the image sensor 100 of the present invention.

Figure 10:
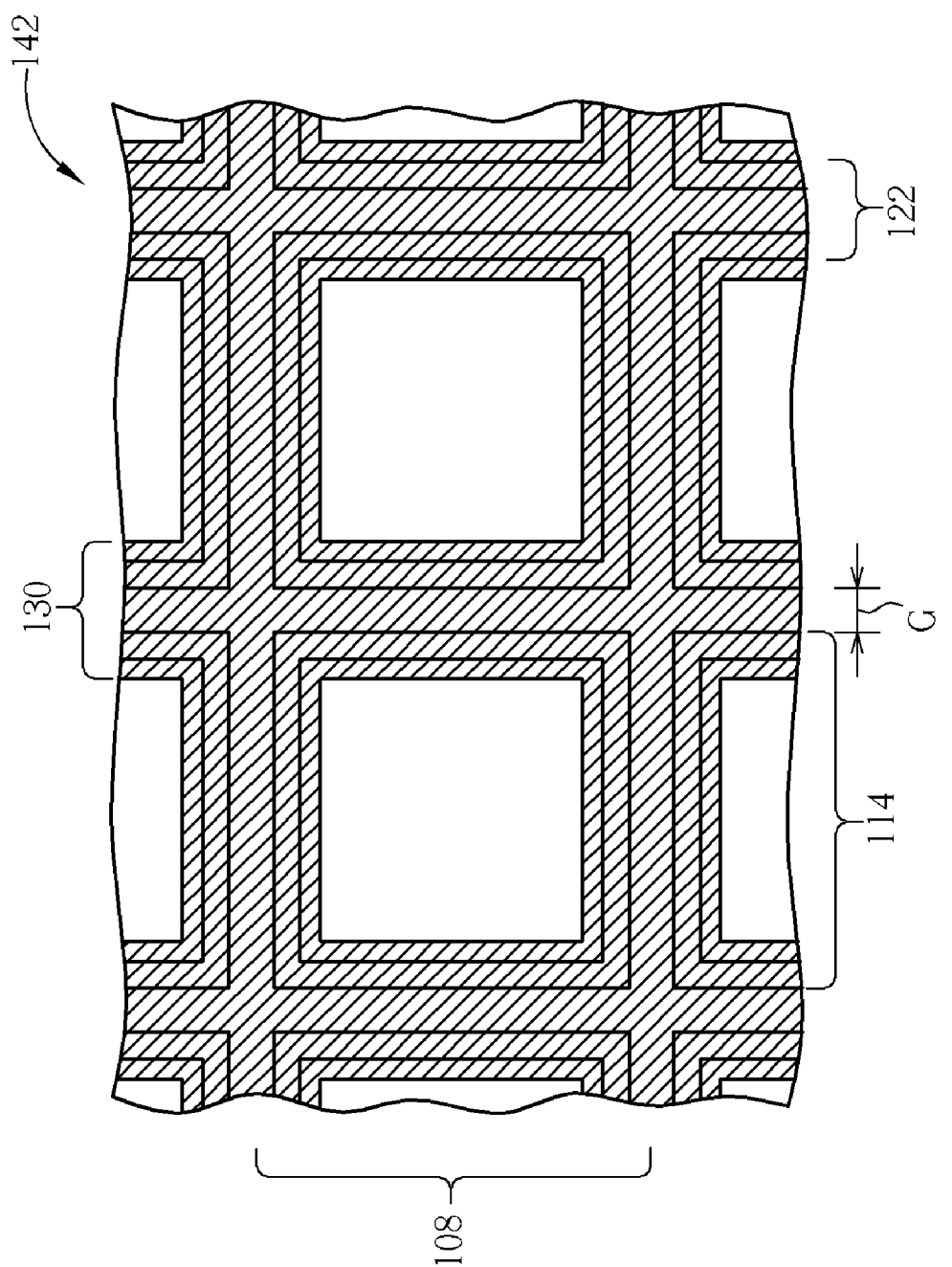
FIG. 10 is a top view of the image sensor according to the present invention.

Please refer to FIG. 10, which is a top view of the image sensor 100 of the present invention. The image sensor 100 comprises a pixel matrix 142, with a plurality of pixels 108 defined on the semiconductor substrate 104. Each pixel 108 contains a pixel electrode 114. Noted that the shield device 130 covers the edge portion of each pixel electrode 114 so that the shield device 130 is as a mesh around each of the pixel electrodes 114. In addition, in preferable embodiments, since the pattern of the shield device 130 is defined by the photomask with the pixel electrode pattern, the areas of the overlapping portions of the shield device 130 and the nearby pixel electrodes 114 are all the same.

The shield electrode 122 of the present invention shield device 130 is grounded (as shown in FIG. 9), with a voltage of 0 v provided by an external potential supply circuit, and there is no current passing through the shield electrode 122 in the pixel matrix 142. Therefore, the shield electrode 122 can reduce the potential near the surface of the electrode gap G to electrically isolate the adjacent pixels 108.

Figure 1:
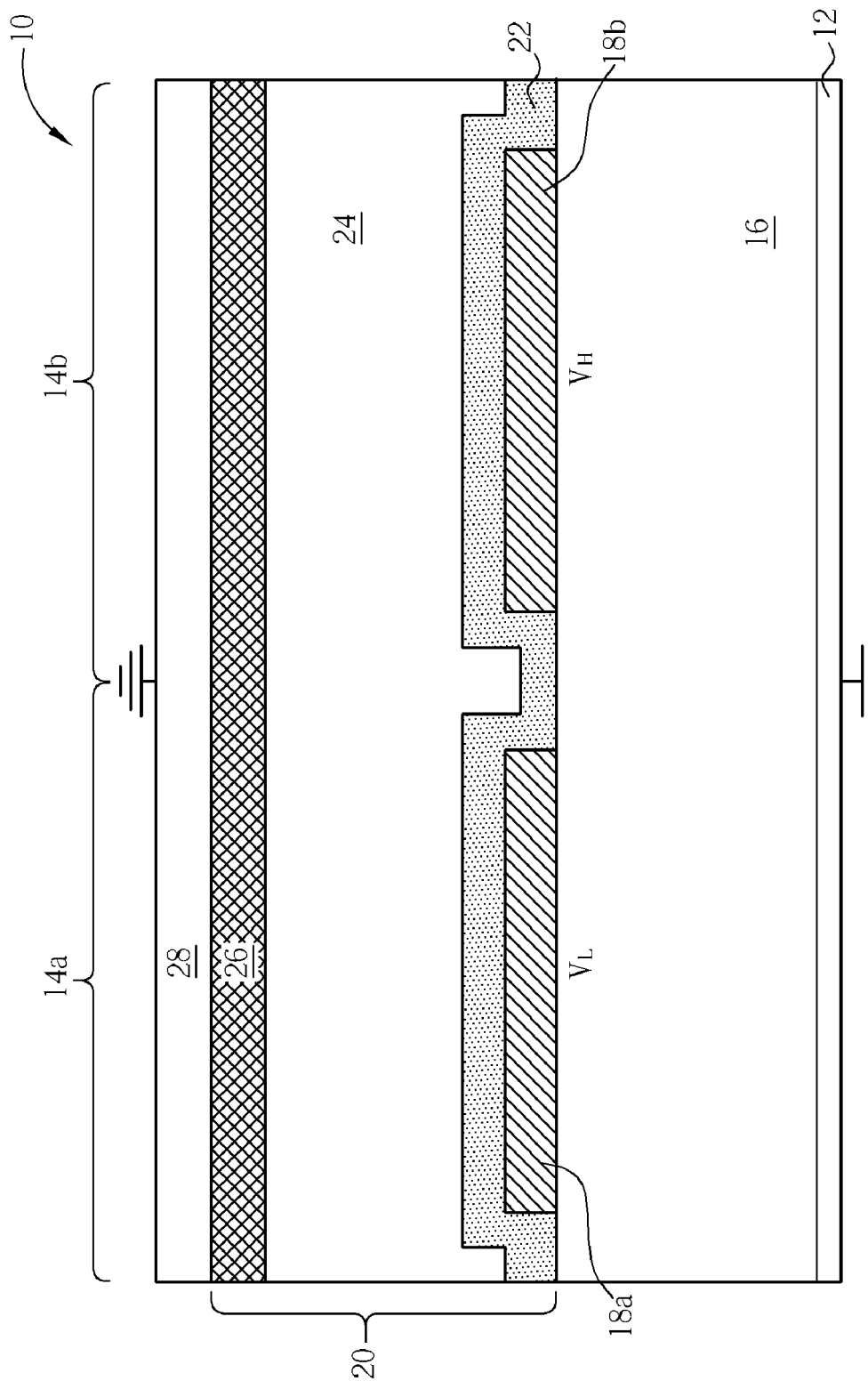
FIG. 1 is a sectional schematic diagram of a prior-art POAP image sensor.
Figure 2:
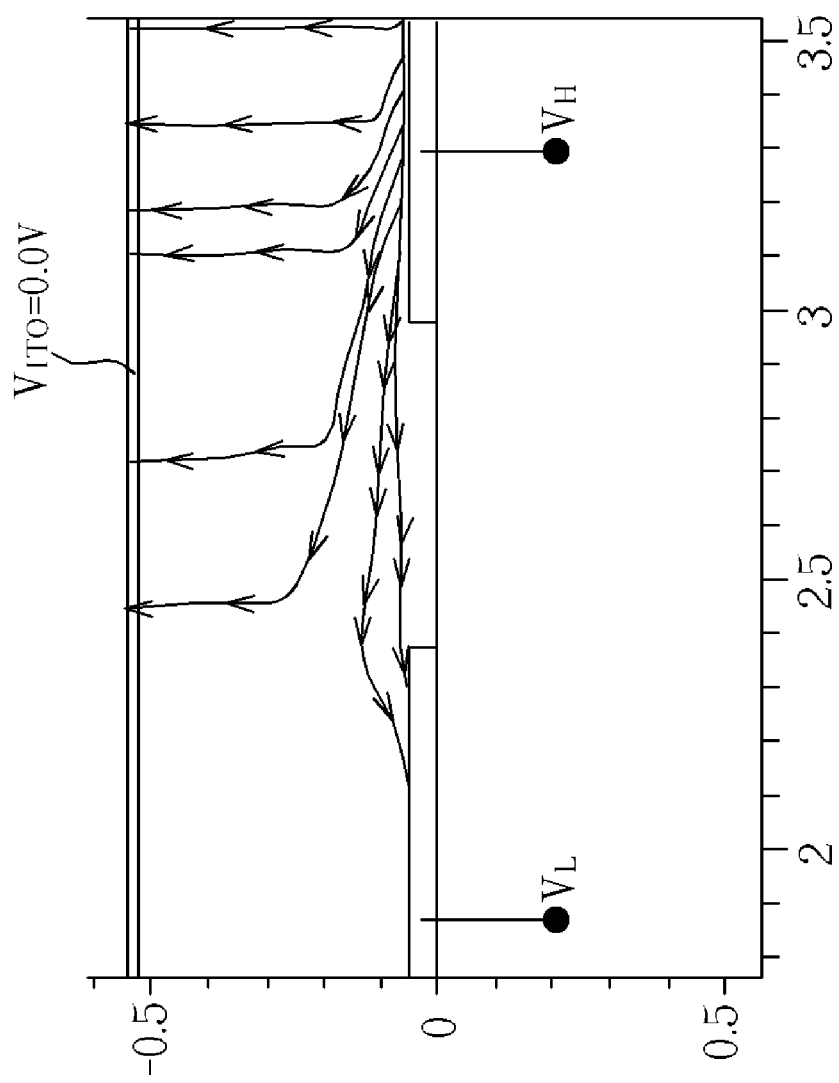
FIG. 2 is a simulation potential diagram of the pixel electrodes shown in FIG. 1.
Figure 11:
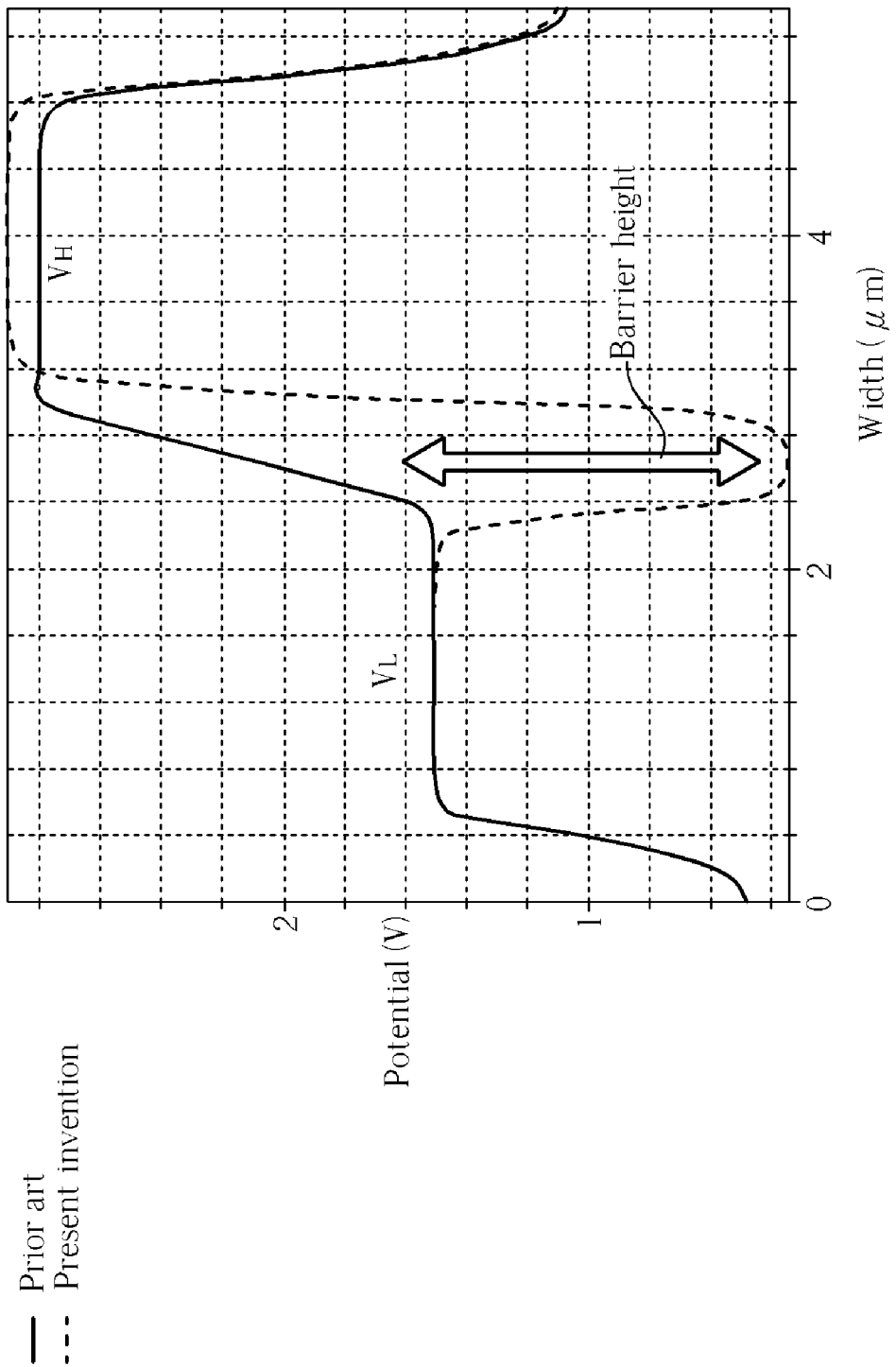
FIG. 11 is a potential diagram of the prior-art image sensor shown in FIG. 1 and the present invention image sensor shown in FIG. 9.

Referring to FIG. 11, FIG. 11 is a potential diagram of the prior-art image sensor 10 shown in FIG. 1 and the present invention image sensor 100 shown in FIG. 9. When the adjacent pixel electrodes have a low potential $V_L$ (such as 1.2 v) and a high potential $V_H$ (such as 2.6 v) respectively, there is no potential barrier height or only a few potential barrier height in the electrode gap between the two pixel electrodes 18a, 18b of the prior-art image sensor 10. Therefore, the electrons generated in the i-layer 24 easily flow from the pixel electrode 18b with a high potential to the pixel electrode 18a with a low potential, occurring cross-talk problems (as shown in FIG. 2). In contrary, although the two adjacent pixel electrodes 114 of the present invention image sensor 100 of FIG. 9 have a high potential $V_H$ and a low potential $V_L$ respectively, there is a big barrier height generated in the electrode gap G that avoids the cross-talk problems, as shown in FIG. 11.

Figure 12:
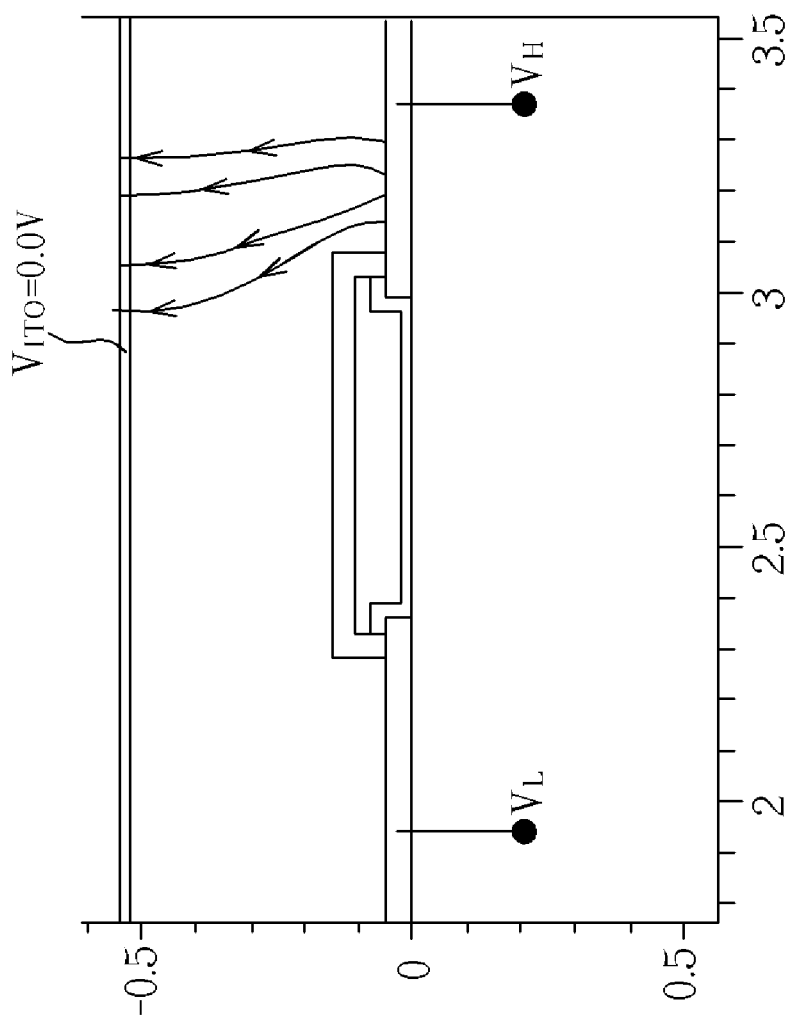
FIG. 12 is a simulation potential diagram of the present invention image sensor shown in FIG. 9.

Please refer to FIG. 12, wherein FIG. 12 is a simulation potential diagram of two adjacent pixels 108 of the present invention image sensor 100 shown in FIG. 9. The two pixel electrodes 114 have a high potential $V_H$ and a low potential $V_L$ respectively, but currents do not flow from the pixel electrode 114 with a high potential to the pixel electrode 114 with a low potential. Therefore, carrier cross-talk will not occur.

In contrast to the prior art, the image sensor structure of the present invention has a shield device disposed between adjacent pixels or adjacent pixel electrodes so that there is a high barrier height at the electrode gap of two adjacent pixel electrodes, which prevents carrier cross-talk and improves the performance of the image sensor. In addition, according to the present invention, the second and third photolithography processes for forming the shield device both use the photomask that defines the pattern of the pixel electrodes, thus no extra cost of photomask is needed. As a result, according to the method of fabricating the image sensor of the present invention, an image sensor with a good performance is provided without increasing lot fabrication costs for forming the shield device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An image sensor comprising:
   a semiconductor substrate;
   a plurality of pixels defined on the semiconductor substrate, each of the pixels comprising a pixel electrode;
   a photo conductive layer and a transparent conductive layer positioned above the pixel electrode in order; and
   a shield device disposed between any two of the adjacent pixel electrodes, the shield device comprising:
   a shield electrode covering edge portions of the two adjacent pixel electrodes; and
   an isolation structure surrounding the shield electrode, wherein the isolation structure having a first isolation layer to isolate the shield electrode from the two adjacent pixel electrodes and a second isolation layer to isolate the shield electrode from the photo conductive layer.

2. The image sensor of claim 1, wherein the shield electrode comprises polysilicon or metal material.

3. The image sensor of claim 1, wherein a bottom surface of the isolation structure and a bottom surface of each of the pixel electrodes are at a same level.

4. The image sensor of claim 1, wherein the shield device covers edge portions of the pixel electrodes, and portions of the pixel electrodes not covered by the shield device direct contact the photo conductive layer.

5. The image sensor of claim 1, wherein the shield device is as a mesh around each of the pixel electrodes.

6. The image sensor of claim 1, wherein the isolation structure comprises silicon oxide ($SiO_2$) or silicon nitride (SiN) materials.

7. The image sensor of claim 1, wherein the shield electrode is grounded.

8. The image sensor of claim 1, wherein the photo conductive layer comprises an n-type layer (n-layer), an intrinsic layer (i-layer), and a p-type layer (p-layer) which are stacked in order.

9. The image sensor of claim 8, wherein the n-layer and the p-layer comprise a hydrogenated amorphous silicon carbide ($\alpha$-SiC:H) material respectively.

10. The image sensor of claim 8, wherein the i-layer comprises a hydrogenated amorphous silicon ($\alpha$-Si:H) material.

11. A method of fabricating an image sensor, comprising:
    providing a substrate;
    forming a first conductive layer on a surface of the substrate;
    removing portions of the first conductive layer to form a plurality of pixel electrodes;
    forming a first isolation layer and a second conductive layer on the substrate in order;
    removing portions of the second conductive layer and the first isolation layer to form a residual first isolation layer and a shield electrode;
    forming a second isolation layer on the substrate;
    removing portions of the second isolation layer to form a residual second isolation layer; and
    forming a photo conductive layer and a transparent conductive layer on the substrate in order;
    wherein the shield electrode is filled into an electrode gap between any two of the adjacent pixel electrodes, the residual first isolation layer and the residual second isolation layer compose an isolation structure surrounding the shield electrode, and the shield electrode and the isolation structure compose a shield device.

12. The method of claim 11, wherein the step of removing the portions of the second conductive layer and the first isolation layer is carried out with a photolithography-etching process (PEP).

13. The method of claim 11, wherein the residual first isolation layer isolates the shield electrode form the pixel electrodes.

14. The method of claim 11 comprising a first photolithography process, a second photolithography process, and a third photolithography process, the first photolithography process adopting a photomask to define a pattern of the pixel electrodes for forming the pixel electrodes, and the second and the third photolithography processes use the same photomask of the first photolithography process to define a complementary pattern that is contrary to the pattern of the pixel electrodes for forming the shield device.

15. The method of claim 14, wherein the first photolithography process utilizes a positive photoresist material to transfer the pattern of the pixel electrodes, and the second and the third photolithography processes utilize negative photoresist materials to transfer the complementary patterns.

16. The method of claim 14, wherein the first photolithography process utilizes a negative photoresist material to transfer the pattern of the pixel electrodes, and the second and the third photolithography processes utilize positive photoresist materials to transfer the complementary patterns.

17. The method of claim 11, wherein a sectional view of the shield electrode comprises a T-shaped profile for covering edge portions of the pixel electrodes.

18. The method of claim 11, wherein the shield electrode comprises polysilicon or metal materials.

19. The method of claim 11, wherein the shield device covers edge portions of the pixel electrodes, and the portions of the pixel electrodes not covered by the shield device are positioned under and directly contact the photo conductive layer.

20. The method of claim 11, wherein the shield device is as a mesh around each of the pixel electrodes.

21. The method of claim 11, wherein the shield electrode is grounded.

22. The method of claim 11, wherein the photo conductive layer comprises an n-layer, an i-layer, and a p-layer stacked in order.

* * * * *